United States Patent
Boscolo et al.

(10) Patent No.: US 6,919,763 B2
(45) Date of Patent: Jul. 19, 2005

(54) TRANSCONDUCTANCE AMPLIFIER FOR INDUCTIVE LOADS AND METHOD FOR DRIVING INDUCTIVE LOADS

(75) Inventors: Michele Boscolo, Chioggia (IT); Ezio Galbiati, Agnadello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 32 days.

(21) Appl. No.: 10/642,394

(22) Filed: Aug. 14, 2003

(65) Prior Publication Data

US 2004/0104772 A1 Jun. 3, 2004

(30) Foreign Application Priority Data

Aug. 30, 2002 (IT) ..................................... MI2002A1867

(51) Int. Cl.[7] .............................. H03F 3/00; H03F 1/36; H02K 23/00
(52) U.S. Cl. .......................... 330/146; 330/85; 318/254
(58) Field of Search .......................... 330/146, 85, 251; 318/254; 323/288

(56) References Cited

U.S. PATENT DOCUMENTS

| 5,481,178 | A | * | 1/1996 | Wilcox et al. ............... 323/287 |
| 5,959,443 | A | * | 9/1999 | Littlefield .................... 323/287 |
| 5,982,160 | A | * | 11/1999 | Walters et al. ............... 323/282 |
| 6,222,356 | B1 | * | 4/2001 | Taghizadeh-Kaschani .. 323/288 |
| 6,479,954 | B1 | * | 11/2002 | Peritore et al. ............. 318/254 |
| 6,791,306 | B2 | * | 9/2004 | Walters et al. ............... 323/288 |

* cited by examiner

Primary Examiner—Patricia Nguyen
(74) Attorney, Agent, or Firm—Lisa K. Jorgenson; E. Russell Tarleton; Seed IP Law Group PLLC

(57) ABSTRACT

A transconductance amplifier for inductive loads and a relevant inductive load driving method, the amplifier having an input stage receiving a driving signal (set-point), a power stage connected downstream of the input stage and connected to the load and an output stage fedback on the input stage to transfer a signal associated to the load. Advantageously, the input stage comprises at least a comparator receiving on one input the driving signal and on another input the output of the output stage. A delay block is also provided between the comparator output and the power stage to delay the comparator switching. This can be obtained also by using a hysteretic comparator.

17 Claims, 10 Drawing Sheets

US 6,919,763 B2

TRANSCONDUCTANCE AMPLIFIER FOR INDUCTIVE LOADS AND METHOD FOR DRIVING INDUCTIVE LOADS

BACKGROUND OF THE INVENTION

1. Field of the Invention

The present invention relates to a current driving system for an electromagnetic load such as a Voice Coil Motor (VCM) used in applications for computer hard disks HDD, stepper motors, etc.

More particularly, but not exclusively, the invention relates to such an amplifier having an input stage that receives a driving signal, a power stage connected downstream of the input stage and connected to the load and an output stage fedback on the input stage to transfer a signal associated to the load, and to a method for driving inductive loads, particularly of the VCM type, wherein a current signal produced by the output of the power stage is applied at one end of the inductive load.

2. Description of the Related Art

As it is well known in this specific technical field, and as shown in FIG. 1, a transconductance amplifier 1 (I/V) typically comprises three main components or blocks: an error amplifier 2, a power stage 3 and a sense amplifier 4 being cascade-connected with each other.

The error amplifier block 2 is generally formed by a fedback operational amplifier, in order to obtain a transfer function effective to ensure a specific system passband.

In applications wherein the electromagnetic load to be driven is represented by an inductor of the VCM (Voice Coil Motor) type, the passband required by the system is around 20–30 KHz in order to ensure small phase-lags for frequencies of some KHz.

The power stage 3 can be of the linear type (in class AB) or of the PWM type (in class D).

The sense amplifier 4 is in turn an operational amplifier but with high CMRR (mainly for driving with PWM signals) and it is capable of outputting a signal that is proportional to the current flowing in the load.

In order to minimize the phase-lag around the most pertinent frequencies also digital solutions have been developed as shown in FIG. 3 wherein the analog error amplifier 2 has been replaced by a digital filter 6 (generally an IIR filter) while the feedback signal has been digitized by using an Analog-to-Digital converter 5 (ADC) downstream of the sensing amplifier 4.

FIGS. 1, 2 and 3 respectively represent:

a known analog solution with a linear power stage;

an analog solution with a PWM power stage; and a digital solution with a PWM power stage.

The digital solution, represented in FIG. 3, allows the filter transfer function to be optimized, and it allows the use of external components (resistors and capacitors) to be avoided, which are necessary when the error amplifier 2 is an operational amplifier. Although advantageous, this solution requires however the use of an Analog-to-Digital converter whose cost is not negligible.

The technical problem underlying the present invention is to provide an analog transconductance amplifier (I/V) structure, particularly for driving capacitive loads, having particularly simple and economical functional and structural features and so as to allow a high passband but void of external components for loop compensation.

BRIEF SUMMARY OF THE INVENTION

The disclosed embodiments of the invention pertain to a transconductance amplifier for inductive loads and related method that uses a comparator in place of an error amplifier block.

From the cost point of view, this solution allows the use of the compensation network required in the case of traditional analog solutions to be avoided, while it avoids the use of an ADC converter in the case of the digital solution.

From the performance point of view, this solution allows a higher passband than the one obtainable by traditional systems for the same load and power stage.

In accordance with another aspect of the present invention, the transconductance amplifier has an input stage with at least one comparator receiving on one input a driving signal and on another input the output of the output signal.

In accordance with a method for driving inductive loads, the driving step occurs by means of a transconductance amplifier and by controlling a load current outputted from a power stage, wherein the power stage control is the output of an inductive load driving comparator.

DETAILED DESCRIPTION OF THE SEVERAL VIEWS OF THE DRAWINGS

The features and advantages of the amplifier and inductive load driving method according to the invention will be apparent from the following description of an embodiment thereof given by way of non-limiting example with reference to the attached drawings.

In the drawings

DETAILED DESCRIPTION OF THE INVENTION

Figure 1:
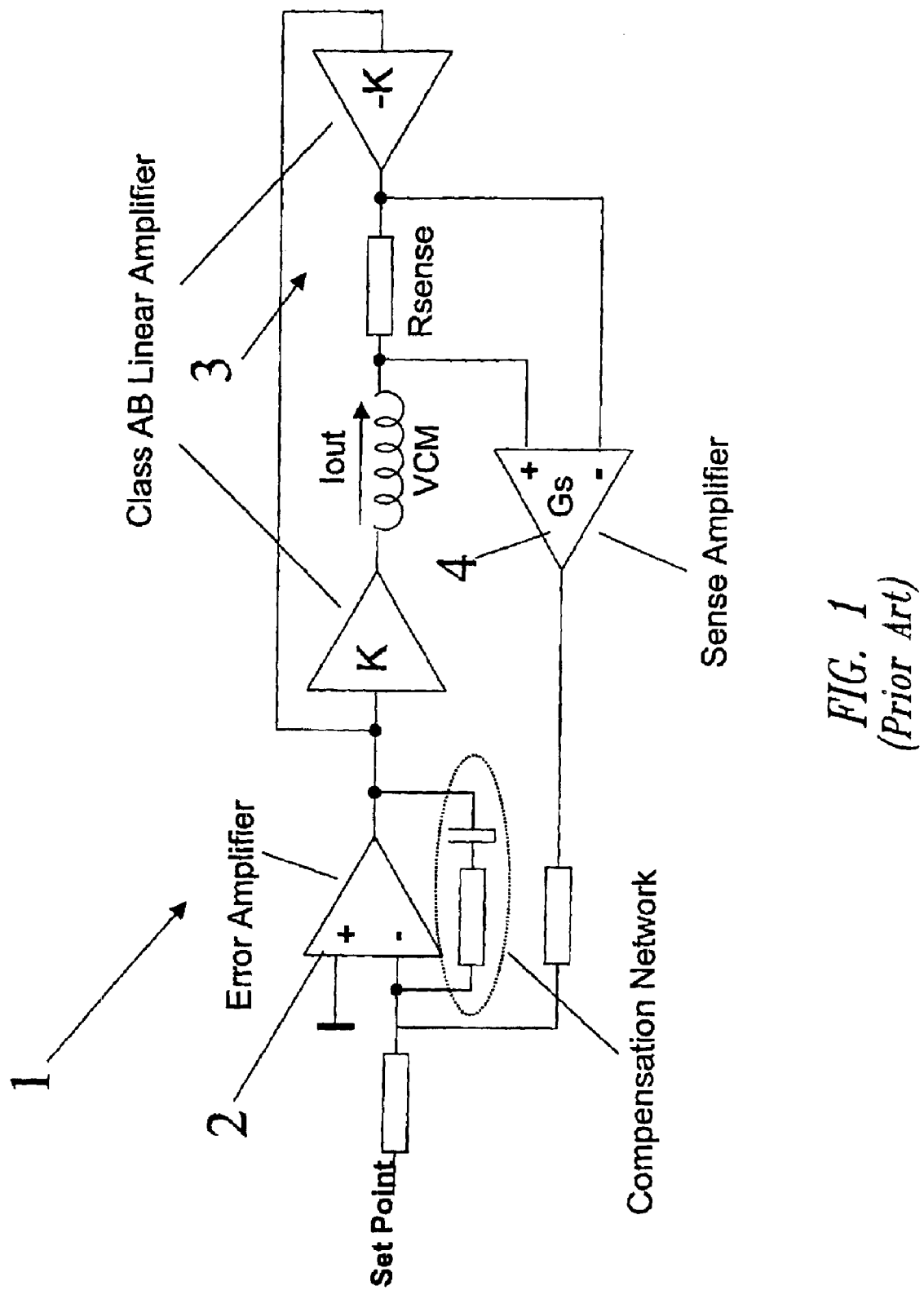
FIG. 1 is a schematic view of an analog transconductance amplifier (I/V) with linear power stage according to the prior art.
Figure 2:
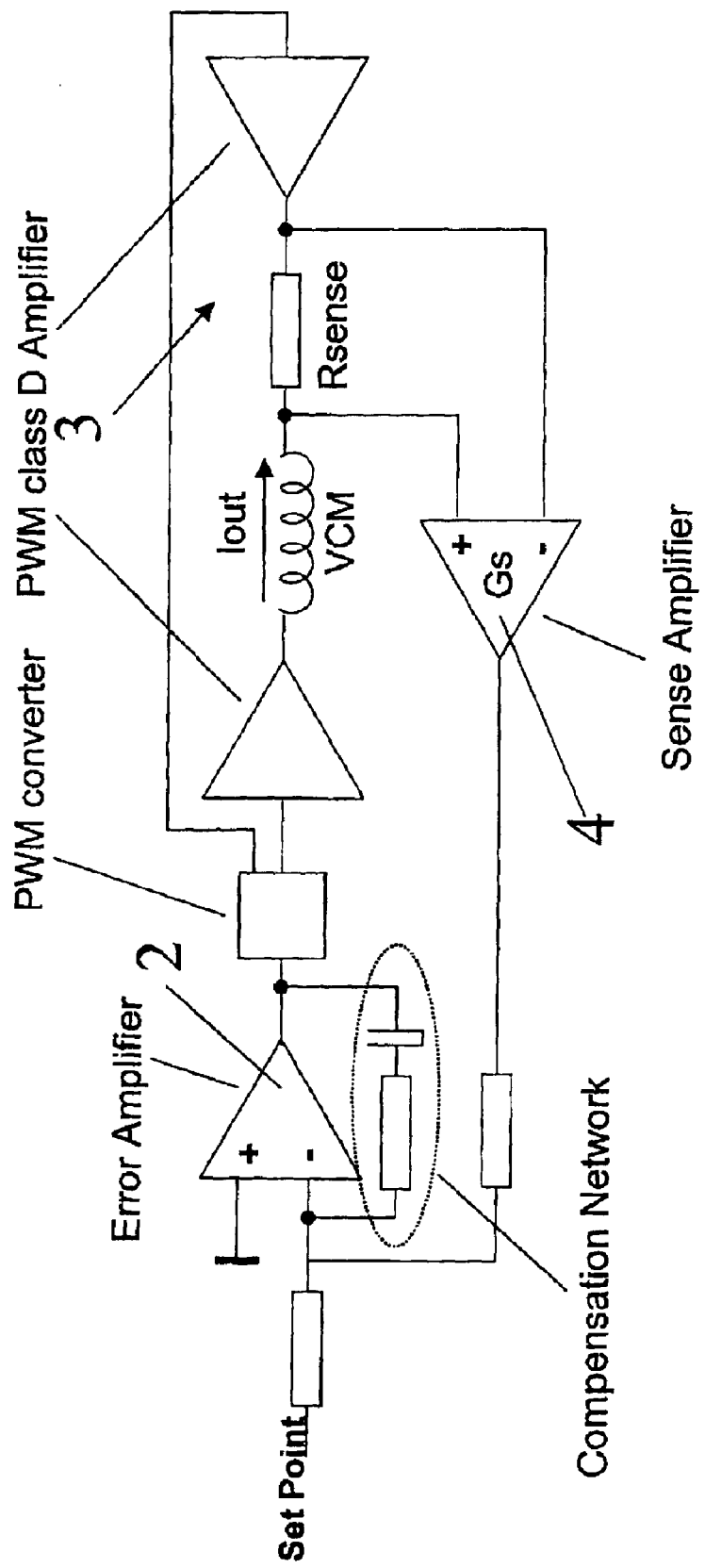
FIG. 2 is a schematic view of an analog transconductance amplifier (I/V) with PWM power stage according to the prior art.
Figure 3:
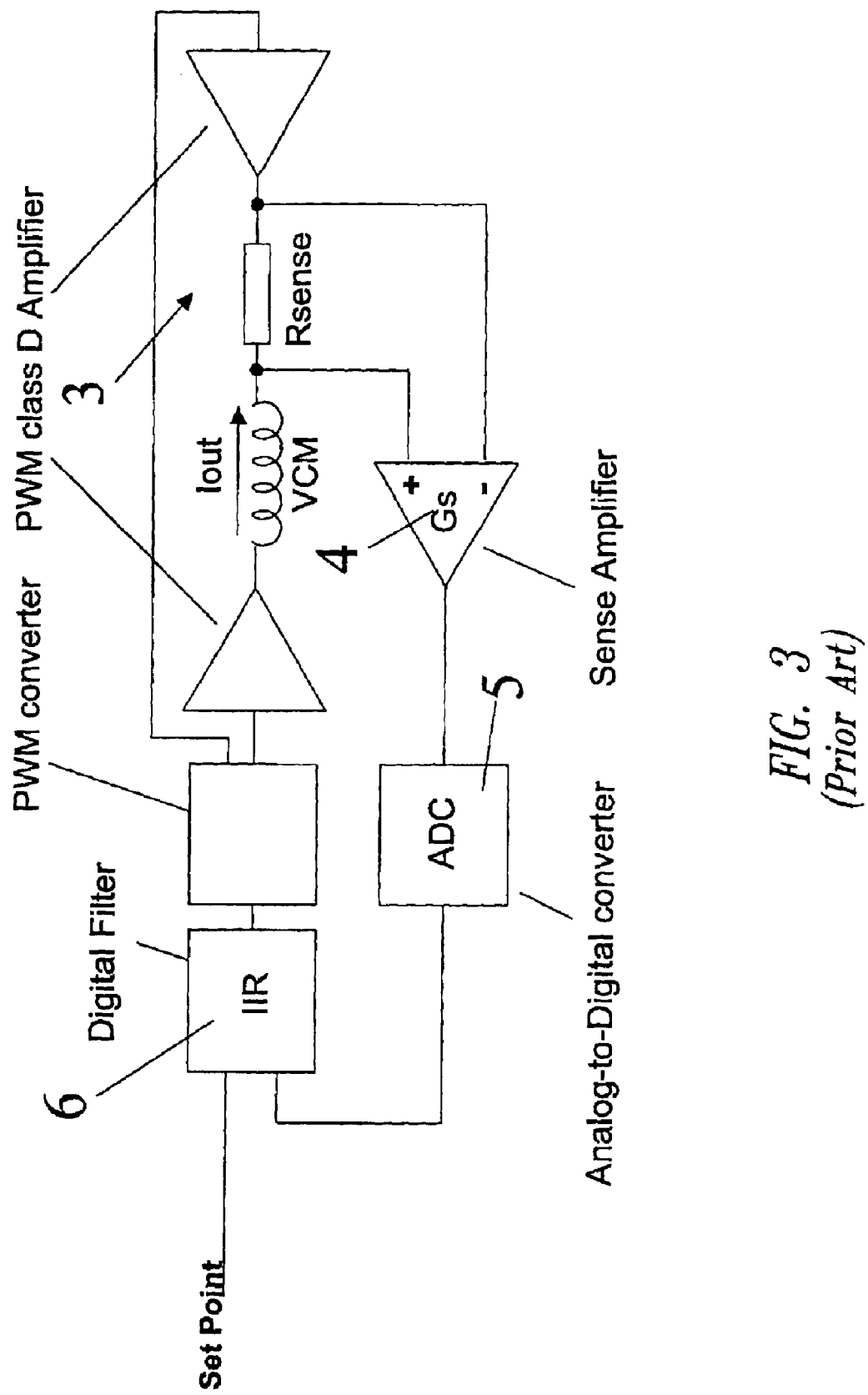
FIG. 3 is a schematic view of a digital transconductance amplifier (I/V) with PWM power stage according to the prior art.
Figure 4:
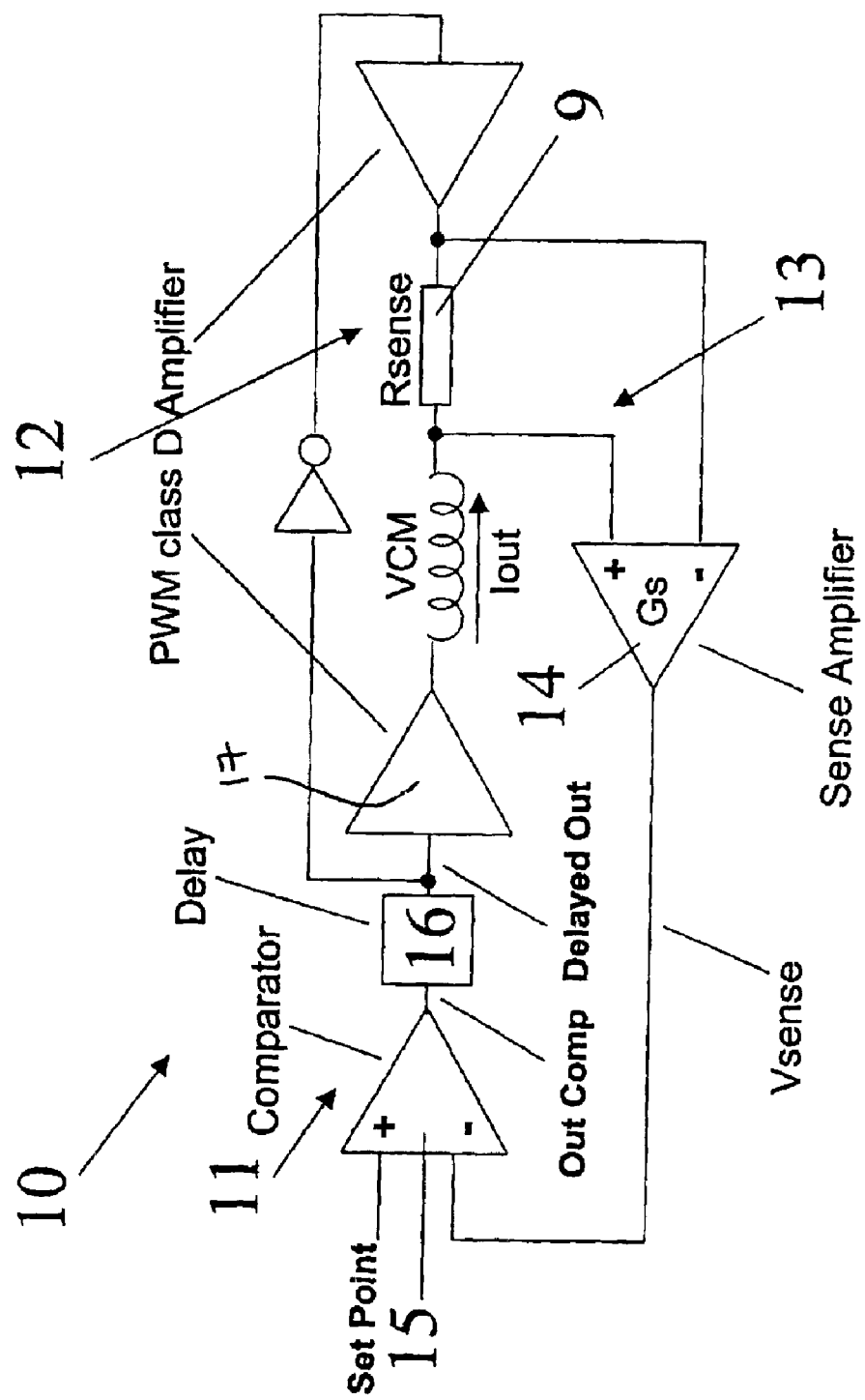
FIG. 4 is a schematic view of a transconductance amplifier (I/V) with PWM power stage according to a first embodiment of the present invention.

With reference to the figures, and particularly to the examples of FIGS. 4 and the following, a transconductance amplifier (I/V) according to the present invention for driving inductive loads, indicated with the abbreviation VCM, is globally and schematically shown with 10.

The amplifier 10 comprises an input stage 11 receiving an input "set point" signal, a power stage 12 connected downstream of the input stage 11 and connected to the load, and an output stage 13 comprising a sense amplifier 14.

The output stage 13 is arranged to detect a signal associated with the load, for example a current Iout flowing through the inductive load VCM.

Advantageously, according to the invention, the input stage 11 comprises a comparator 15 receiving directly the input signal on one of its inputs.

The comparator 15 receives on another input a signal Vsense outputted from the output of the sense amplifier 14 of the output stage 13.

A delay block 16 is provided in cascade with the comparator 15. The delay time "d" is adjustable and programmable.

Both the load VCM and the power stage 12, comprising a pair of signal PWM amplifiers 17, 18, are inserted between the delay block 16 output and the sense amplifier 14. Preferably, but not necessarily, these amplifiers 17, 18 are of class D.

An amplifier 17 input is directly connected to the delay block 16 output, while an amplifier 18 input is connected to the same output of the delay block 16 through an inverter 20.

The respective outputs of amplifiers 17, 18 are connected to the inductive load VCM. A sensor 9 is inserted between the amplifier 18 output and the load, at whose ends respective signals are drawn for the sense amplifier 14 inputs.

Figure 6:
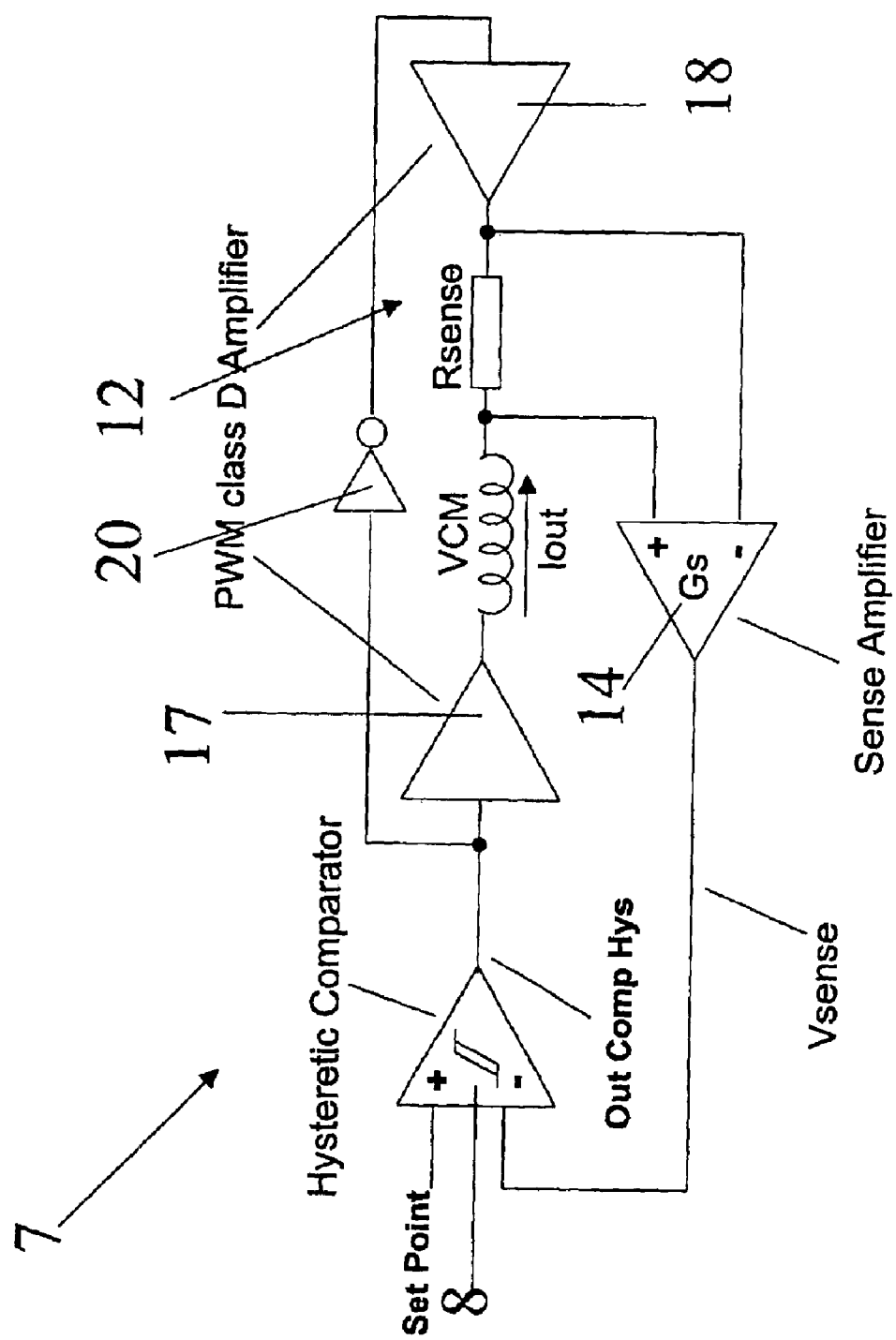
FIG. 6 is a schematic view of a second embodiment of the amplifier of the present invention.

FIG. 6 shows an amplifier structure 7 being very similar to the one of FIG. 4, but with the difference that the comparator 15 and the delay block 16 are replaced by a hysteretic comparator 8.

In substance, the transconductance amplifier according to the present invention can be manufactured in two different ways:

1) forming the error amplifier block used in the prior art by means of a comparator 15 and a delay block 16;

2) forming the error amplifier block used in the prior art by means of a hysteretic comparator 8.

The diagram of the first solution, the one of FIG. 4, exploits the time delay "d" of the block 16 at the comparator output in order to reduce the switching frequency of the power stage 12 output. In fact, in the case of an ideal power stage, i.e. an infinite band, and of an ideal comparator, with in turn infinite band and sensitivity, the output switching frequency would tend to infinity.

Figure 5:
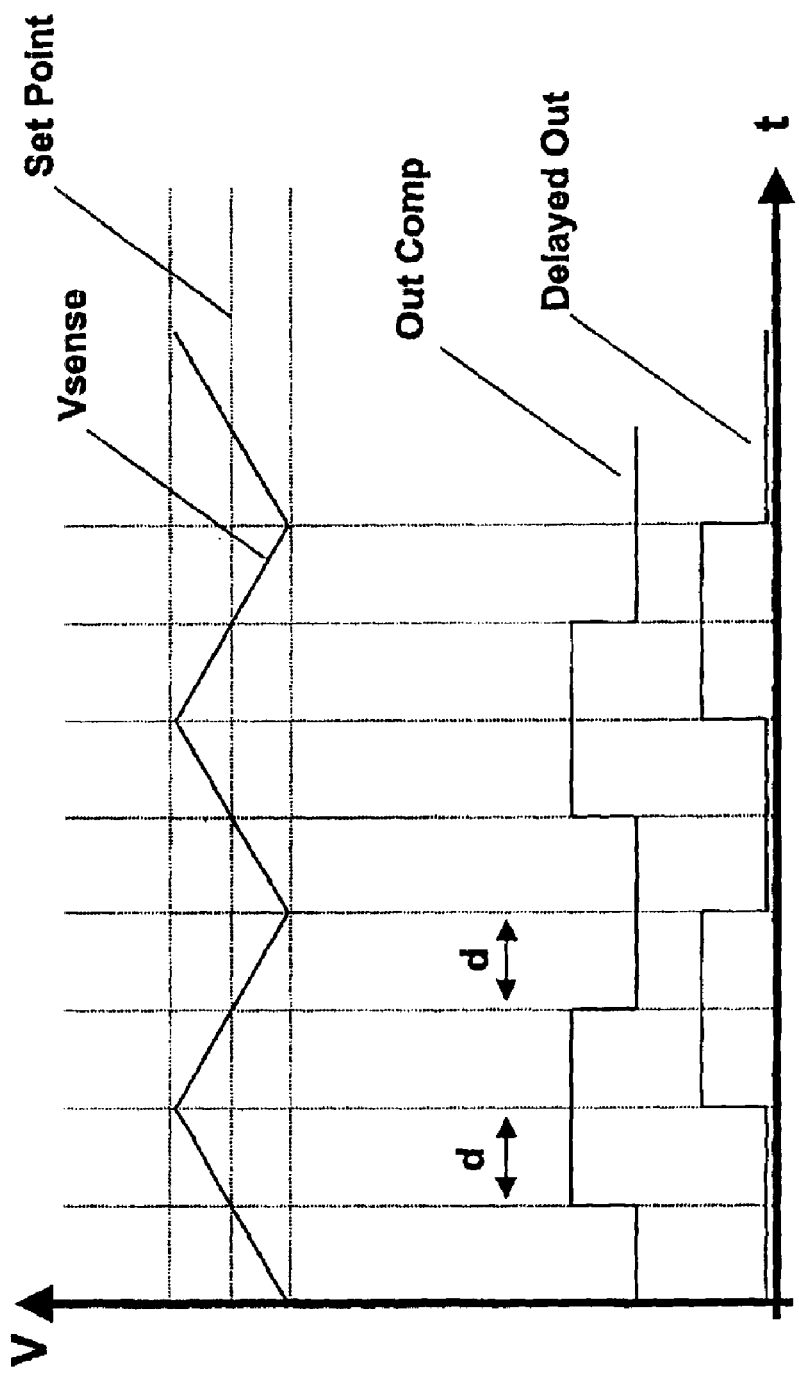
FIG. 5 shows in a time-equally-based diagram a series of signals of the amplifier according to the present invention.

The signals of interest from amplifier 10 have been shown in FIG. 5. From the diagram of FIG. 5 it can be understood that The signal Vsense, representing the VCM current, has an average value being equal to the one of the "set-point" signal, as desired.

The diagram of the second suggested solution, the one of FIG. 6, exploits instead the comparator 8 hysteresis to limit the switching frequency of the power stage 12 outputs.

The comparator 8 output does not undergo switchings until the signals at the input thereof have a differential value, of convenient sign, of module corresponding to Vhys.

Figure 7:
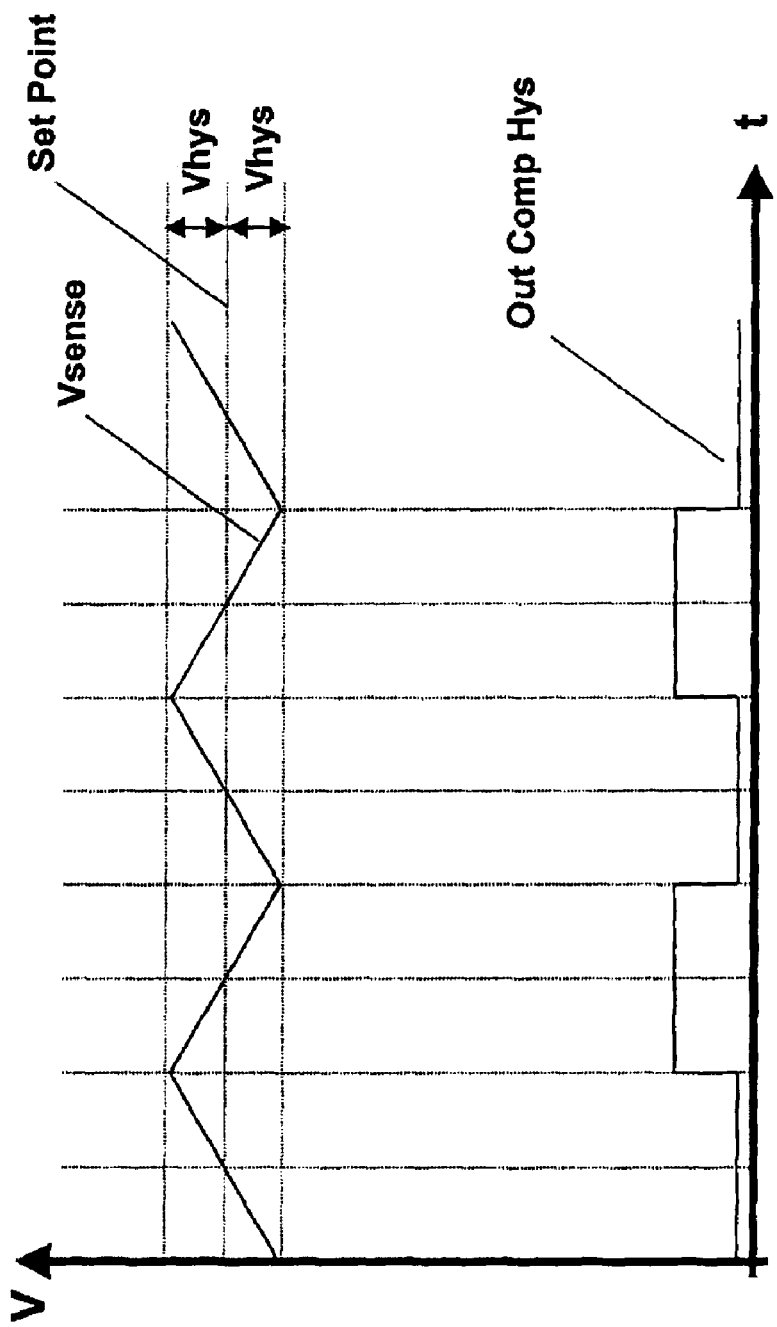
FIG. 7 shows in a time-equally-based diagram a series of signals of the amplifier of FIG. 6.

The main interesting signals of the amplifier 7 shown in FIG. 6 have been shown in FIG. 7.

In both solutions of FIGS. 4 and 6, the gain DC of the transconductance amplifier is determined by the gain (Gs) of the sense amplifier 14 and by the value of the sensor 9 resistance Rs.

In a formula:

$$Iout = SetPoint/(Rsense * Gs)$$

Therefore both solutions are applicable to a 100% PWM or linear-PWM mixed power stage.

Figure 8:
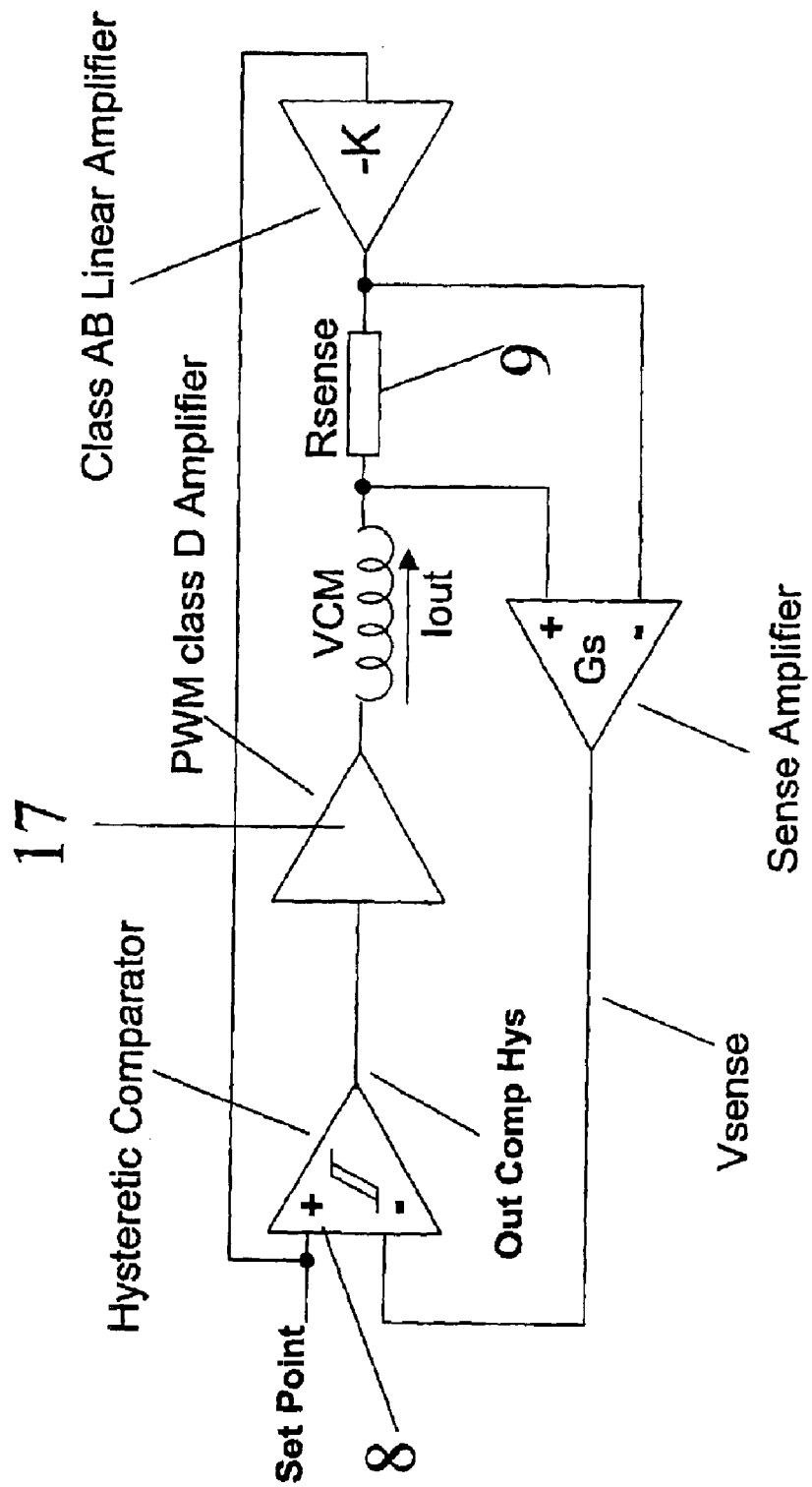
FIG. 8 is a schematic view of a transconductance amplifier according to the first embodiment of the present invention applied to a linear-PWM mixed power stage.
Figure 9:
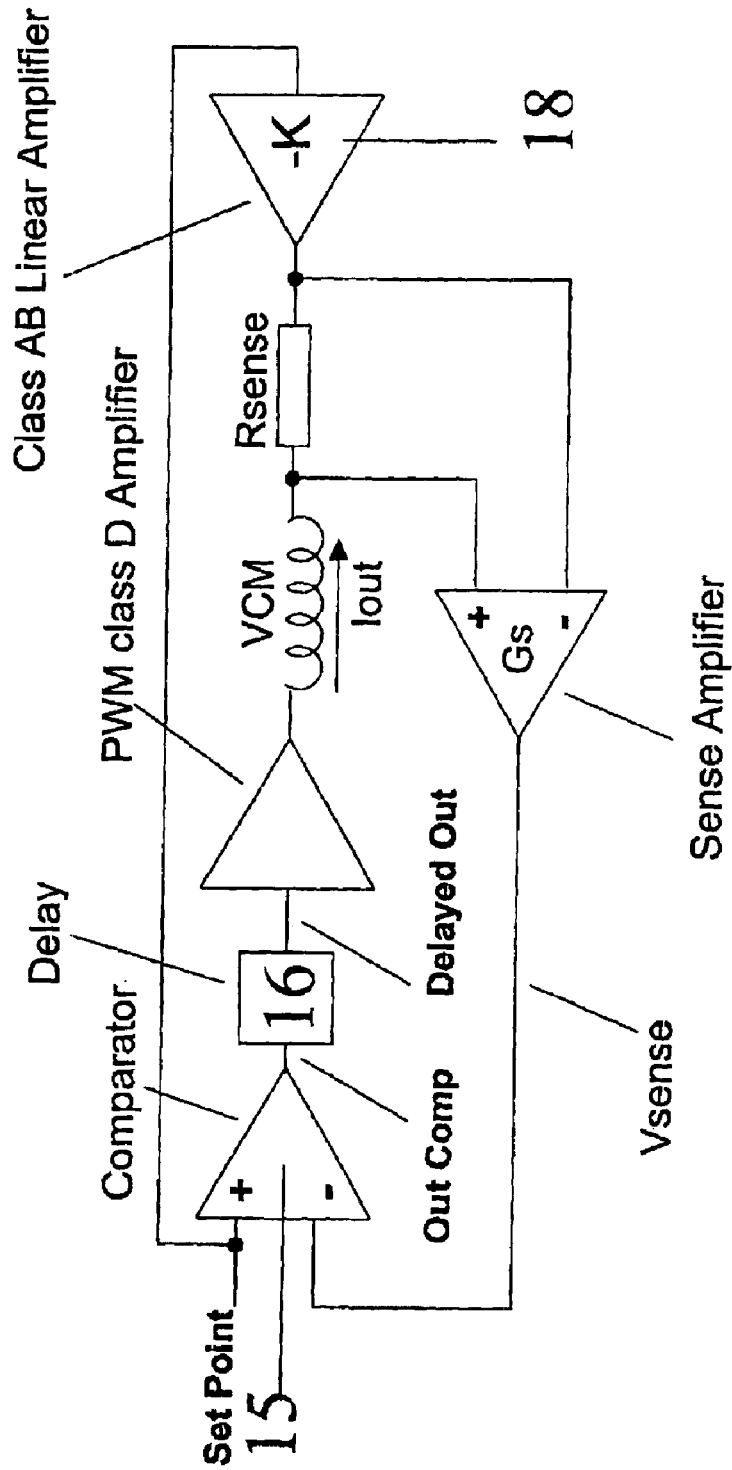
FIG. 9 is a schematic view of a transconductance amplifier according to the second embodiment of the present invention applied to a linear-PWM mixed power stage.

At this purpose, FIGS. 8 and 9 schematically show the application of the principles of the present invention to a 100% PWM power stage and to a linear-PWM mixed power stage respectively, as described in the Italian/European patent application n. of the applicant itself [01-AG-280].

The solution provided by the present invention applied to a transconductance amplifier with linear-PWM mixed output stage is particularly indicated when it is necessary to control very precisely the load current.

In fact high frequency switchings of the output stage, occurring with frequencies of hundreds of KHz, in a 100% PWM solution limit the sense amplifier CMRR and endanger the performance of the transconductance amplifier itself.

The solutions shown in FIGS. 8 and 9 respectively allow a differential signal across the sense amplifier insulated by the switching noise and thus a very precise voltage Vsense, as required in several applications.

For example, in FIG. 8 the amplifier 18 of the power stage 12 is of the linear type in class AB and it has a gain of –K. This power stage is combined in FIG. 8 to the comparator 15 and to the delay block 16, while FIG. 9 shows the combination solution with the hysteretic comparator 8.

Figure 10:
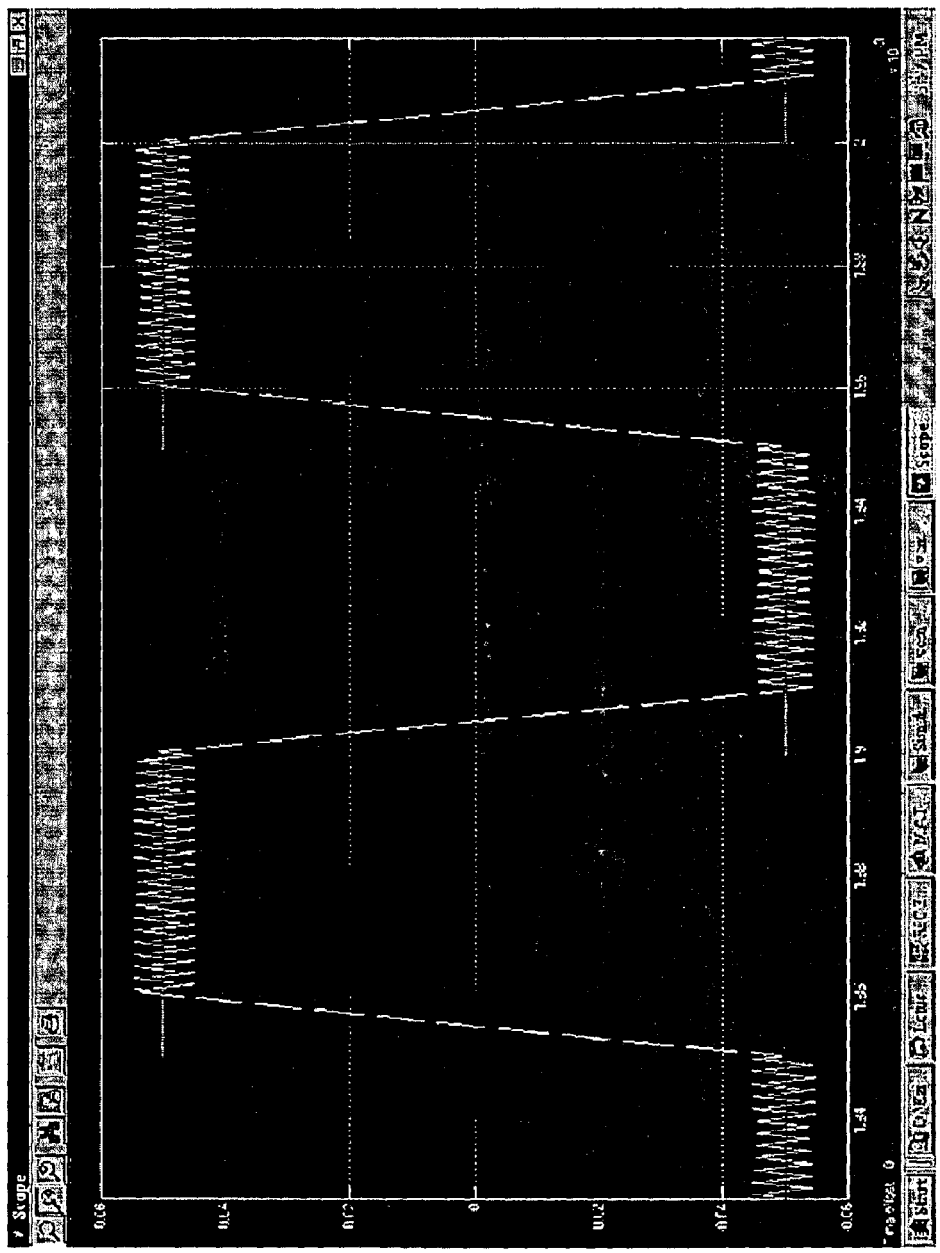
FIG. 10 is a schematic view of the result of an amplifier simulation in the configuration of FIG. 4.

FIG. 10 shows the result of a simulation undergone by the amplifier according to the invention by the Applicant, particularly in the configuration of FIG. 4. An ohmic-inductive load (RL) has been used, with a time constant L/R equal to 100 us (quantity of a VCM for HDD) and the delay "d" has been chosen equal to 500 ns.

The output stage switching frequency is equal to 500 KHz.

From the above it evidently results that the solution provided by the invention does not require any compensation network and it thus avoids the use of external components. A considerable cost reduction of the whole amplifier is thus obtained.

Other advantages are given by the fact that it is not necessary to use an Analog-to-Digital converter.

Moreover, the passband is improved with respect to prior art embodiments.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A transconductance amplifier for an inductive load, comprising:

an input stage for receiving a driving signal (set-point), a power stage connected downstream of the input stage and connected to the load, an output stage fedback on the input stage to transfer a signal associated with the load, the input stage comprising at least one comparator for receiving on an input the driving signal and on another input the output of the output stage, the amplifier further comprising a delay block coupled between the comparator output and the power stage.

2. The amplifier of claim 1 wherein a time "d" of the delay block is adjustable and programmable.

3. The amplifier of claim 1 wherein the comparator comprises a hysteretic comparator.

4. The amplifier of claim 1 wherein the power stage comprises a pair of class D amplifiers connected to the load.

5. The amplifier of claim 1 wherein the power stage comprises a pair of amplifiers connected to the load, the one in class D and the other in class AB.

6. The amplifier of claim 5 wherein the amplifier of class AB has a gain −K.

7. The amplifier of claim 2 wherein an adjustable time "d" of said delay block is of at least 500 ns.

8. A method for driving inductive loads, comprising:
a driving step using a transconductance amplifier, and controlling a load current outputted from a power stage by utilizing an output of a comparator, and wherein the comparator is delayed in switching by a programmable delay.

9. The method of claim 8 wherein the comparator comprises a hysteretic comparator.

10. A circuit, comprising:
an inductive load; and
a transconductance amplifier, comprising:
an input stage comprising a comparator having a first input for receiving a driving signal and a second input for receiving a feedback signal, and an output;
a power stage coupled to the input stage via a delay block, the power stage having an output; and
a sensing stage coupled to the power stage and to the second input of the comparator for controlling the power stage.

11. The circuit of claim 10 wherein the input stage comprises at least one comparator.

12. A transconductance amplifier for an inductive load, the amplifier comprising:
a comparator having a first input for receiving a driving signal and a second input for receiving a feedback signal and an output;
a delay block having an input coupled to the output of the comparator and an output;
a first amplifier having an input coupled to the output of the delay block and an output configured to be coupled to the load;
a second amplifier having an input coupled to the output of the delay block via an inverter and an output;
a sense resistor having a first terminal coupled to the output of the second amplifier and a second terminal coupled to the load; and
a sense amplifier having a first input coupled to the first terminal of the sense resistor and a second input coupled to the second terminal of the sense resistor and configured to generate the feedback signal at an output coupled to the second input of the comparator.

13. A transconductance amplifier for an inductive load, comprising:

a hysteretic comparator having a first input for receiving a driving signal and a second input for receiving a feedback signal, and an output;

a first amplifier having an input coupled to the output of the hysteretic comparator and an output configured to be coupled to the load;

a second amplifier having an input coupled to the output of the hysteretic comparator via an inverter and an output;

a sense resistor having a first terminal coupled to the output of the second amplifier and a second terminal coupled to the load; and a sense amplifier having a first input coupled to the first terminal of the sense resistor and a second input coupled to the second terminal of the sense resistor and configured to generate the feedback signal on an output coupled to the second terminal of the hysteretic comparator.

14. The amplifier of claim 13 wherein the first amplifier comprises a PWM class deamplifier and the second amplifier comprises a class AB linear amplifier.

15. A transconductance amplifier for an inductive load, comprising:
a comparator having a first input configured to receive a driving signal and a second input configured to receive a feedback signal, and an output;
a delay block having an input coupled to the output of the comparator and further comprising an output;
a first amplifier having an input coupled to the output of the delay block and an output configured to be coupled to the load;
a second amplifier having an input coupled to the first input of the comparator and an output;
a sense resistor having a first terminal coupled to the output of the second amplifier and a second terminal configured to be coupled to the load; and
a sense amplifier having a first input coupled to the first terminal of the sense resistor and a second input coupled to the second terminal of the sense resistor and configured to generate a feedback signal on an output coupled to the second terminal of the comparator.

16. A method for driving an inductive load, comprising:
receiving a signal at an input stage;
driving the signal via a power stage through the load; and
controlling a load current outputted from the power stage via the output of a comparator, wherein the comparator is configured to generate an output, and further comprising delaying the output of the comparator by a programmable delay.

17. The method of claim 16 wherein the comparator comprises a hysteretic comparator.

* * * * *